(12) United States Patent
Doany et al.

(10) Patent No.: US 9,576,836 B2
(45) Date of Patent: Feb. 21, 2017

(54) DAMAGE-FREE SELF-LIMITING THROUGH-SUBSTRATE LASER ABLATION

(71) Applicant: International Business Machines Corporation, Armonk, NY (US)

(72) Inventors: Fuad E. Doany, Katonah, NY (US); Chandrasekhar Narayan, San Jose (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/930,993

(22) Filed: Nov. 3, 2015

(65) Prior Publication Data
US 2016/0133468 A1 May 12, 2016

Related U.S. Application Data

(60) Provisional application No. 62/076,917, filed on Nov. 7, 2014.

(51) Int. Cl.
*H01L 21/683* (2006.01)
*B23K 26/40* (2014.01)

(52) U.S. Cl.
CPC ......... *H01L 21/6835* (2013.01); *B23K 26/402* (2013.01); *H01L 2221/68381* (2013.01)

(58) Field of Classification Search
CPC .............. H01L 21/268; H01L 21/6835; H01L 2221/6835
See application file for complete search history.

(56) References Cited

U.S. PATENT DOCUMENTS

| 3,905,676 | A | * | 9/1975 | Ulrich | G02B 6/29334 385/36 |
|---|---|---|---|---|---|
| 5,258,236 | A | | 11/1993 | Arjavalingam | |
| 2012/0091587 | A1 | * | 4/2012 | Or-Bach | H01L 21/6835 257/741 |
| 2012/0118511 | A1 | * | 5/2012 | Imai | B32B 38/10 156/712 |

(Continued)

OTHER PUBLICATIONS

P. Andry et al. "Advanced Wafer Bonding and Laser Debonding". 2014 Electronic Components & Technology Conference. pp. 883-887, May 27-May 30, 2014.

(Continued)

*Primary Examiner* — Fernando L Toledo
*Assistant Examiner* — Neil Prasad
(74) *Attorney, Agent, or Firm* — Daniel P. Morris; Otterstedt, Ellenbogen & Kammer, LLP

(57) ABSTRACT

A first substrate, bonded to a second substrate by a material, is provided. The first substrate is transparent to at least some wavelengths of electromagnetic radiation. The first substrate is irradiated with the electromagnetic radiation to which the first substrate is transparent, such that the electromagnetic radiation impinges on the material causing a decomposition thereof at a location at an interface between the first substrate and the material. The decomposition results in, at the location, an interface of the first substrate and an atmosphere of the decomposition. The atmosphere of the decomposition has an optical property resulting in ceasing the decomposition of the material.

18 Claims, 11 Drawing Sheets

(56) References Cited

U.S. PATENT DOCUMENTS

2014/0147986 A1* 5/2014 Dang ............... H01L 21/02002
438/458

OTHER PUBLICATIONS

Bing Dang et al. "CMOS Compatible Thin Wafer Processing using Temporary Mechanical Wafer, Adhesive and Laser Release of Thin Chips/Wafers for 3D Integration". 2010 Electronic Components and Technology Conference. pp. 1393-1398, 2010.

* cited by examiner

DAMAGE-FREE SELF-LIMITING THROUGH-SUBSTRATE LASER ABLATION

CROSS-REFERENCE TO RELATED APPLICATIONS

This application claims the benefit of U.S. Provisional Application Ser. No. 62/076,917 filed 7 Nov. 2014, entitled DAMAGE-FREE SELF-LIMITING THROUGH-SUBSTRATE LASER ABLATION, the complete disclosure of which, including appendices, is expressly incorporated herein by reference in its entirety for all purposes.

FIELD OF THE INVENTION

The present invention relates to fabrication of integrated circuits, and, more particularly, to laser assisted de-bonding for temporary wafer handling, and the like.

BACKGROUND OF THE INVENTION

Laser assisted de-bonding is a pertinent process for temporary wafer handling in complementary metal oxide semiconductor (CMOS) processing and the like. Referring to FIG. 1, the de-bonding process involves a temporary glass wafer 102 that is bonded to the device wafer 104 using high-temperature adhesive polymer 106. The initial state is shown at 112. This approach facilitates further device processing on a thin device wafer. A through-glass laser ablation step is performed to separate (de-bond) the temporary glass wafer from the device wafer. The laser is seen at 118 and is omitted from views 114, 116. The de-bonding process relies on high-power pulsed lasers to ablate a thin polymer layer at the interface. State 114 shows a gap 108 in polymer 106 resulting from ablation. State 116 is the end state wherein the glass carrier 102 and wafer 104 are separated as seen at 110. Laser ablation is a non-linear process with a threshold requiring a minimum power for ablation. Excess laser power or an excess number of pulses may cause damage to underlying devices (laser ablation produces a shock wave that propagates through the polymer). A relatively small laser spot size must be scanned across the entire wafer. The current process requires precise control of laser fluence (energy per unit area) and avoiding exposure to excessive total pulses.

Thus, temporary wafer bonding and de-bonding are pertinent enabling processes for 2.5D and 3D packaging technology. A glass handling wafer is temporarily bonded to a workpiece (e.g. thinned device wafer) using an adhesive polymer to enable further processing. Laser de-bonding is a pertinent technology used to degrade the adhesive polymer layer and to separate the workpiece from the temporary glass wafer.

U.S. Pat. No. 5,258,236, hereby expressly incorporated herein by reference in its entirety for all purposes, teaches the laser assisted de-bonding process. A high power pulsed laser is directed to the polymer/glass interface through the glass wafer. The laser is used to ablate a thin polymer layer at the interface. The laser ablation process is a nonlinear process that relies on high-power pulsed lasers and requires a minimum power (threshold) to degrade the polymer. However, since high power lasers are required, excess laser power or an excess number of pulses may cause damage to the underlying devices in the workpiece.

B. Dang at al., "CMOS compatible thin wafer processing using temporary mechanical wafer, adhesive and laser release of thin chips/wafers for 3D integration," Electronic Components and Technology Conference (ECTC), 2010 Proceedings 60th, pp. 1393-1398, 1-4 Jun. 2010, is hereby expressly incorporated herein by reference in its entirety for all purposes. Furthermore, P. Andry et al., "Advanced Wafer Bonding and Laser De-bonding," Electronic Components and Technology Conference (ECTC), 2014 Proceedings 64th, pp. 883-887, May 2014, is hereby expressly incorporated herein by reference in its entirety for all purposes. The aforementioned B. Dang at al. and P. Andry et al. papers show modifications and further examples of the laser de-bonding process, although these may still be prone to potential damage problems as discussed herein.

Referring to FIG. 2, consider aspects of lasers such as laser 118 used for the ablation process. The laser beam will typically have a Gaussian profile 202 where the fluence will vary across the beam profile. Suppose the threshold fluence is 0.1 $J/cm^2$; only the portion of the beam above the line 204 (0.1-0.2 $J/cm^2$) has the required fluence; the region below (0-0.1 $J/cm^2$) does not—see notation 208. As indicated by arrow 206, the beam is scanned across the region to be irradiated. Arrow 210 shows scanning to the right while arrow 212 shows scanning back to the left. Regions 214, 216, 218 show the irradiated regions from the pulses with at least the minimum value of the fluence on the rightward scan, while regions 224, 222, 220 show the irradiated regions from the pulses with at least the minimum value of the fluence on the leftward scan. It can be seen that there is overlap and potential excess incident energy at the following locations:

1. right-hand edge of 214 overlaps left-hand edge of 216;
2. right-hand edge of 216 overlaps left-hand edge of 218;
3. right-hand edge of 222 overlaps left-hand edge of 224;
4. right-hand edge of 220 overlaps left-hand edge of 222;
5. bottoms of 214, 216, 218 respectively overlap tops of 220, 222, 224.

It will thus be appreciated that it is difficult to achieve a uniform dose (particularity with a non-linear threshold process).

Typical lasers used in the ablation process include high power pulsed ultraviolet (UV) lasers (a few nsec pulse duration in some cases; in some cases, say 10 nsec). This is a nonlinear process with an approximately 100 $mJ/cm^2$ fluence threshold for the ablation of polymers. The dose is not cumulative; only pulses (or portions of pulses) above the threshold will ablate polymer. Multiple pulses will continue to ablate polymer leading to possible damage.

The wavelength should have good transmission in the glass wafer 102. Common lasers include excimer lasers (e.g., XeCl at 308 nm and XeF at 351 nm) and a Tripled Q-switched 1064 nm Nd:YAG laser (3rd harmonic at 355 nm).

Excimer lasers require complex optics to deal with their highly non-uniform beam profile. These include laser beam homogenizers and complex optical systems to deliver the beam to the target, as required for high-cost, high maintenance Excimer lasers. An approximately one cm spot size is scanned across the target.

Nd:YAG lasers require precise control of power and scan parameters to ensure minimum dose applied. They exhibit a Gaussian beam profile (Non-uniform) such that fluence varies across the beam profile. Precision control of the scanned Gaussian beam profile is required. Power control of the highly non-linear 3rd harmonic is required. Nd:YAG lasers are lower power than excimer lasers and typically have about a 0.2 mm spot size used in a high-speed raster scan across the target. Nd:YAG lasers are typically lower cost, low-maintenance lasers.

Referring now to FIG. 3, in a current process, the laser will continue to impinge on polymer 106 after polymer 106 delaminates from glass 102. Power is reduced by only about 4% due to reflection at the glass/"air" interface, and the laser will continue to ablate the polymer 106 for multiple pulses. Similar elements in the figures have received the same reference character. In particular, view 302 shows the first pulse wherein beam 308 impinges (typically near-normally) on polymer 106. Subsequent pulses of the beam (e.g. 310) are shown in view 304. In region 306, the polymer has ablated and delaminated from the glass creating an "air" gap; the above-mentioned glass/"air" interface is at the top of region 306. Please note that throughout this patent application, references to the "air" gap should be understood to include air, vapor or gaseous material resulting from ablation of the polymer, a mixture of air and vapor or gaseous material resulting from ablation of the polymer; a gas or gas mixture other than air (e.g., when process is carried out in an environment other than normal atmosphere), and/or a mixture of a gas or gas mixture other than air and vapor or gaseous material resulting from ablation of the polymer.

SUMMARY OF THE INVENTION

Principles of the invention provide techniques for damage-free self-limiting through-substrate laser ablation. In one aspect, an exemplary method includes the steps of providing a first substrate bonded to a second substrate by a material, the first substrate being transparent to at least some wavelengths of electromagnetic radiation; irradiating the first substrate with the electromagnetic radiation to which the first substrate is transparent, such that the electromagnetic radiation impinges on the material causing a decomposition thereof at a location at an interface between the first substrate and the material; the decomposition resulting in, at the location, an interface of the first substrate and an atmosphere of the decomposition, the atmosphere of the decomposition having an optical property resulting in ceasing the decomposition of the material.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can make use of a computer program product including a computer readable storage medium with computer usable program code for performing the method steps indicated (e.g., to control the laser pulsing and/or the motion of the substrate with respect to the laser). Furthermore, one or more embodiments of the invention or elements thereof can make use of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include one or more of (i) hardware module(s), (ii) software module(s) stored in a computer readable storage medium (or multiple such media) and implemented on a hardware processor, (iii) a combination of (i) and (ii), (iv) specific apparatus disclosed herein; any of (i)-(iv) implement the specific techniques set forth herein.

Techniques of the present invention can provide substantial beneficial technical effects; for example, any one, some, or all of the following:

Avoids potential damage of subsequent pulses
Works well for all laser systems (both excimer and Nd:YAG)
Relaxes scan requirements (power control, beam overlap, and so on)
Relaxes material absorption property requirements
Reduces concerns about mechanical damage to circuitry.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

One or more embodiments advantageously provide a self-limiting laser process that prevents excess pulses from causing damage. One or more embodiments provide a technique for limiting the laser dose to prevent damage from additional laser pulses. Current processes require precise control of laser fluence (energy per unit area, e.g. $mJ/cm^2$) and avoiding exposure to excessive total pulses. In contrast, one or more embodiments employ the Total Internal Reflection (TIR) principle to reduce or even completely eliminate excess pulses that can lead to damage.

In one or more embodiments, the laser light is directed to the glass/polymer interface at an angle approximately 45 degrees from normal. Since the glass and polymer have similar indices of refraction, the light will travel through the interface and ablate a thin layer of the polymer. The ablation process separates the polymer from the glass and creates a gaseous pocket. The index difference of the glass/gas interface is then sufficiently large to exceed the TIR condition for the laser incidence angle, and will thus reflect any additional laser pulses incident at this interface.

Figure 1:
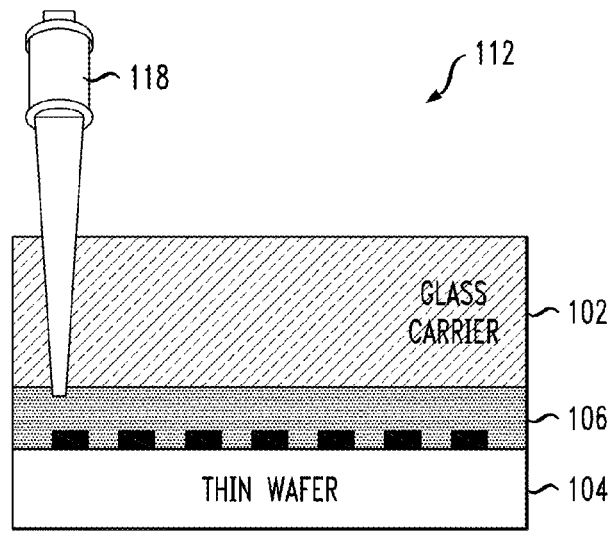
FIG. 1 presents a laser de-bonding process, according to the prior art.
Figure 1:
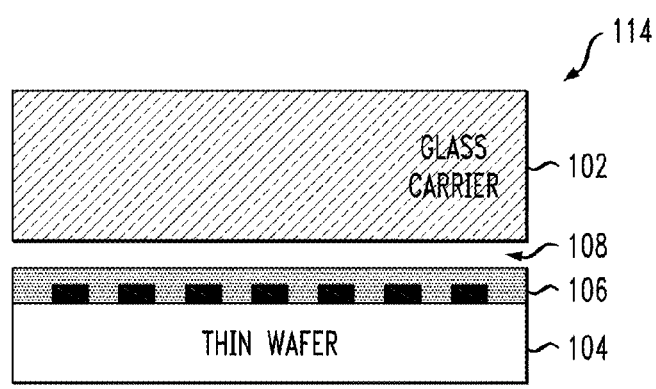
Figure 1:
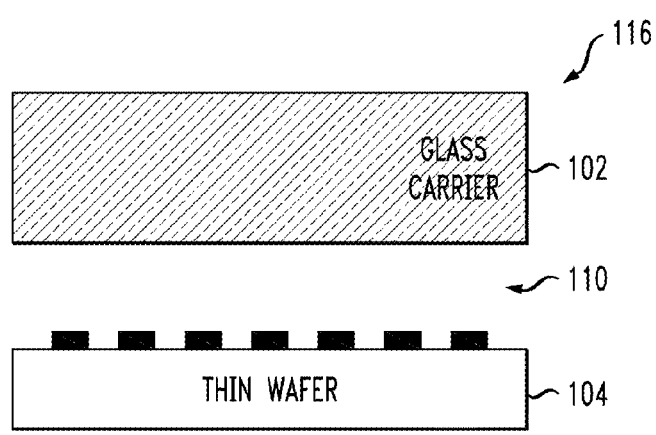
Figure 2:
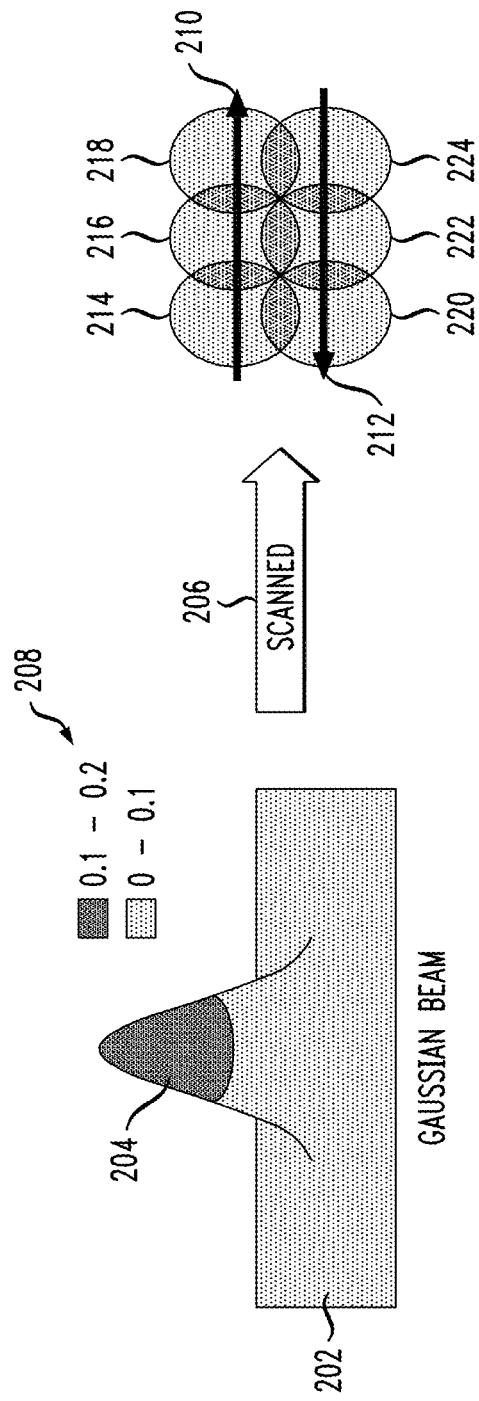
FIG. 2 presents properties of a laser beam, according to the prior art.

Note that a Gaussian beam has been shown in the example of FIG. 2. However, embodiments of the invention can be used with Gaussian or non-Gaussian beams. For examples, some embodiments could be used with an excimer laser with a beam homogenizer resulting in a fairly square or uniform (as opposed to Gaussian) beam. However, advantageously, one or more embodiments are not limited to excimer lasers but can also be used with other types of lasers (Nd:YAG lasers are a non-limiting example).

Figure 4:
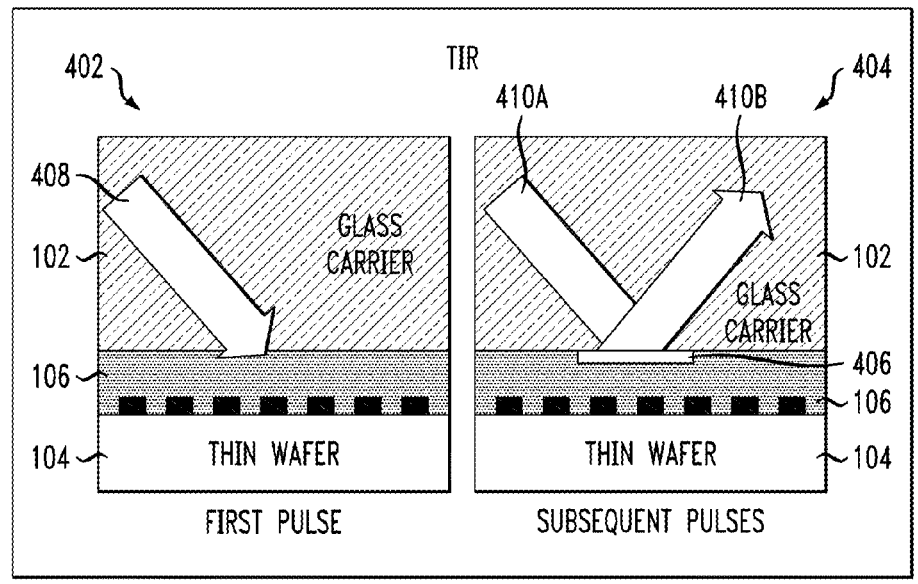
FIG. 4 presents a laser de-bonding process using total internal reflection (TIR), according to an aspect of the invention.

Refer now to FIG. 4. In the exemplary TIR process depicted in FIG. 4, view 402 shows the first pulse wherein beam 408 impinges (at an approximately 45 degree angle to the polymer-glass interface) on polymer 106. Subsequent pulses of the beam (e.g. 410A and 410B) are shown in view 404. In region 406, the polymer has ablated creating an "air" gap; the glass/"air" interface is at the top of region 306. The first pulse in view 402 ablates a thin polymer layer and delaminates from the glass, creating gaseous pocket 406 at the interface; the subsequent laser pulses (e.g. 410A) shown in view 404 are reflected (e.g. 410B) from the glass/gas interface due to the TIR condition (at about 45 degrees).

The transparent substrate is typically a glass or fused silica material, which is transparent at visible or near-ultraviolet wavelengths. However, other substrates such as semiconductor wafers (GaP, GaAs, InP, Si) can be used which are transparent at infrared wavelengths (800 nm-2000 nm). In this case, the ablation laser wavelength should also be in the infrared, such as an Nd:YAG laser at 1064 nm. The adhesive layer is typically a polyimide polymer, although other polymers such as epoxies and silicones may also be used. The device wafer is typically a semiconductor wafer, such as silicon, GaAs, InP, or the like. The devices may also be fabricated on a glass wafer, such as a liquid-crystal flat panel display (i.e., the "thin" wafer can also be glass).

Figure 3:
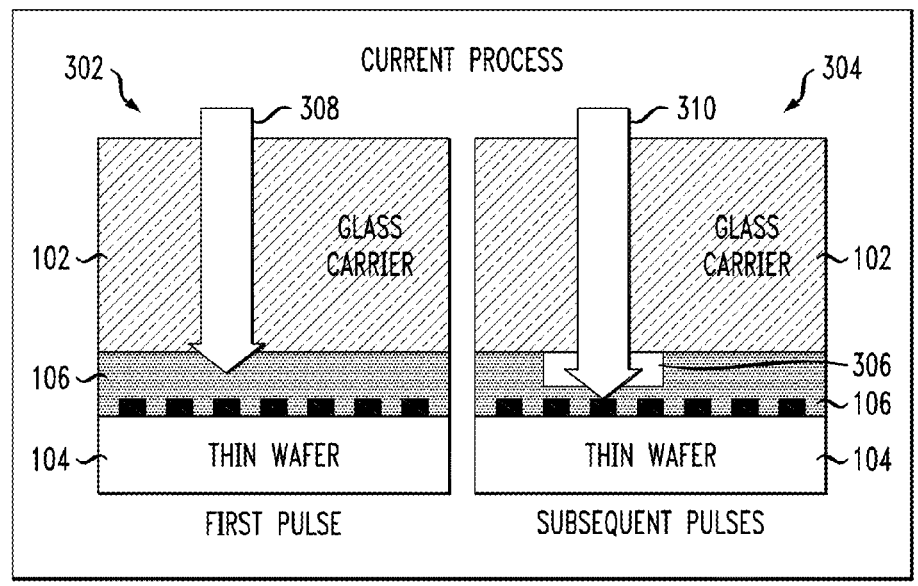
FIG. 3 presents a laser de-bonding process, according to the prior art.

FIGS. 3 and 4 thus compare prior art (near normal laser incidence) to an exemplary embodiment using a 45 degree angle of incidence laser.

Figure 5A:
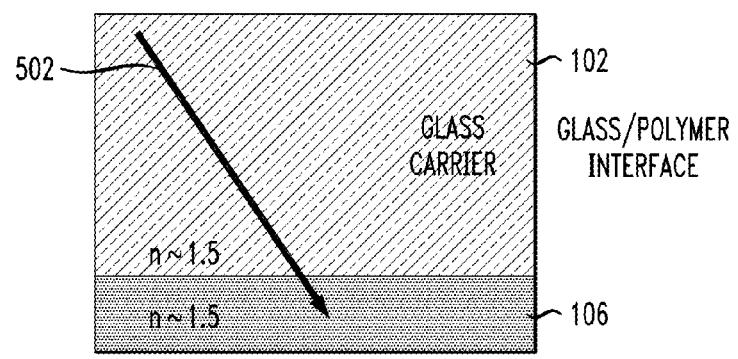
FIGS. 5A-5C presents aspects of total internal reflection, as used in one or more embodiments of the invention.
Figure 5B:
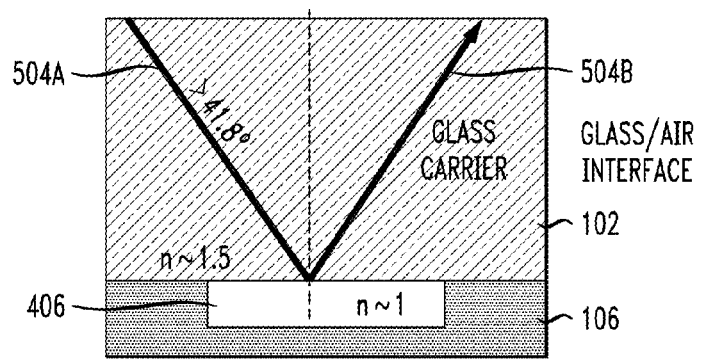
Figure 5C:
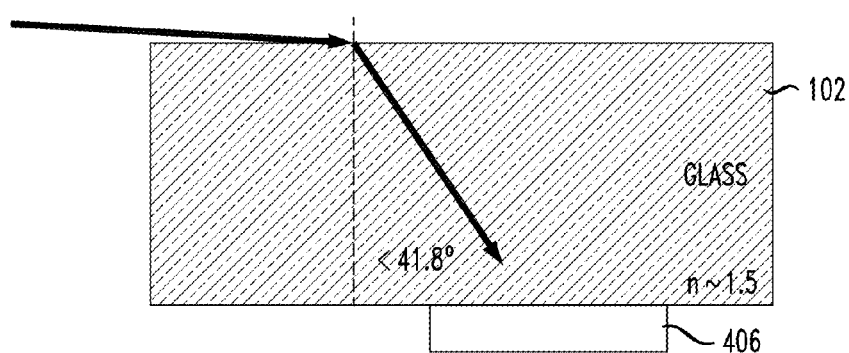

Referring now to FIGS. 5A-5C, consider the TIR (total internal reflection) effect to limit the dose to a single pulse, provided that the pulse has adequate power to exceed the ablation threshold fluence. For the first pulse in FIG. 5A, the glass/polymer interface is nearly index-matched and light (beam 502) will travel through the interface. The laser ablates a sub-micron layer of polymer (the sub-micron layer ablates before the thermal energy from the laser can dissipate throughout the polymer—the process is basically thermal and may have photochemical aspects in some circumstances) and creates "air" pocket 406 in FIG. 5B. For the second and following pulses, light (e.g., beam 504A) will reflect off the glass/"air" interface (e.g., beam 504B) when the TIR condition is exceeded. In this example, this will be for an angle of incidence greater than 41.8° using glass index of 1.5 and air index of 1.0. According to Snell's Law:

$n_1 \sin \theta_1 = n_2 \sin \theta_2$, for $\theta_1 = 90°$ (n1=1, n2=1.5).
Thus, the polymer 106 below "air" pocket 406 will not see subsequent pulses.

Note, however (referring to FIG. 5C) that an incidence angle >41.8° in glass cannot be achieved in a plane-parallel glass substrate, based on Snell's law from air-to-glass. The maximum angle that can be achieved in glass is for 90 degree angle of incidence in air, which results in 41.8° in the glass. Thus, the angle of incidence will, undesirably, be less than 41.8°.

One or more embodiments overcome the difficulty in FIG. 5C via one or more of:
  Glass prism index-matched to glass wafer
  Wedged glass wafer
  Micro-structured Glass wafer.

Figure 6A:
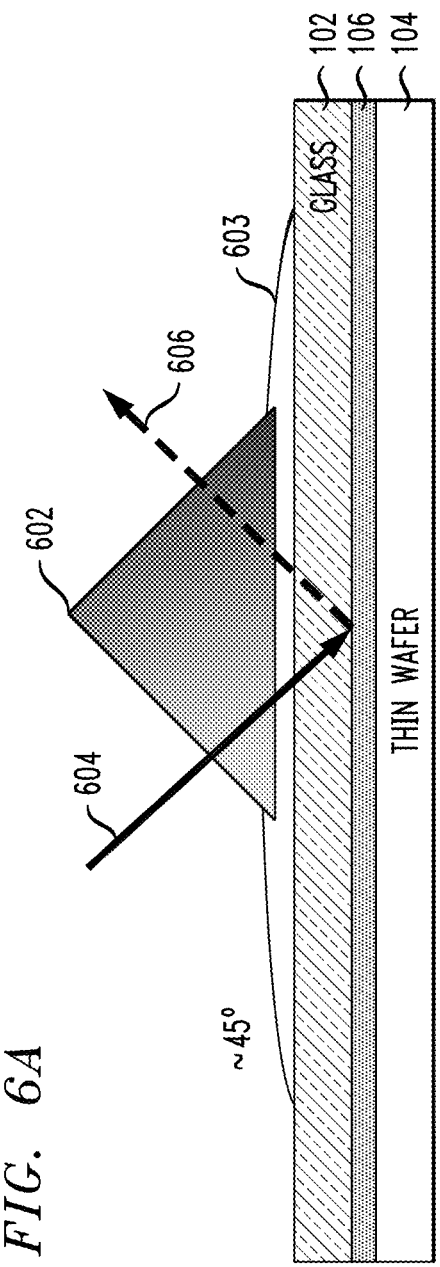
FIGS. 6A-6D present exemplary embodiments of a glass prism index-matched to a glass wafer, according to aspects of the invention.
Figure 6B:
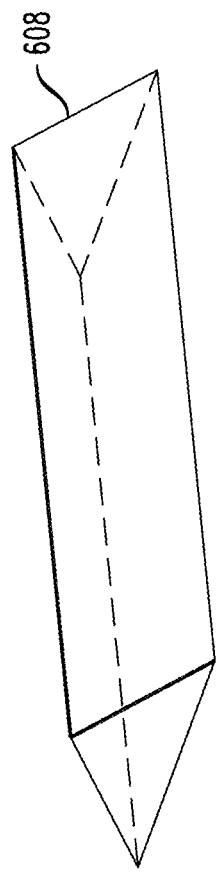
Figure 6C:
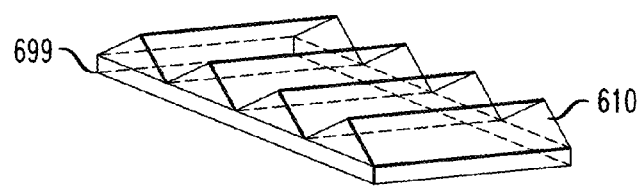

FIGS. 6A-6D shows variants of a glass prism index-matched to the glass wafer. The laser is incident at 45 degrees and continues at 45 degrees to the glass substrate/polymer interface. In FIG. 6A, there is a 45° laser input angle (beam 604) and a prism 602 with index matching fluid 603 on glass wafer 102. The index matching fluid is typically glycerol, although any fluid with index of refraction close to the glass may be used, including optical gels, oil immersion fluids used in optical microscopy, and water. The index matching need not be precise, as the incident light angle in the glass prism will be maintained in the transparent glass substrate even if refracted within the thin fluid layer. The glass wafer 102 is scanned underneath glass prism 602. In FIG. 6B, the length of the prism 608 is equal to the wafer diameter; thus, the laser is scanned along the length of the prism 608 and the wafer is stepped. In FIG. 6C, the prism length is equal to the wafer diameter, and an array 610 of prisms are employed for a single substrate. Thus, the laser is scanned along the length of each of the prism elements in the array; no prism translation is required using the prism sheet. The embodiment in FIG. 6D uses a single large prism 612 similar in size to the glass wafer 102. An incident beam is shown at 614 with the totally reflected beam at 616. In this embodiment, either the laser itself is scanned in both directions across the prism surface or the entire assembly of glass wafer with attached large prism is scanned while the laser is stationary, or a combination of both.

Figure 7A:
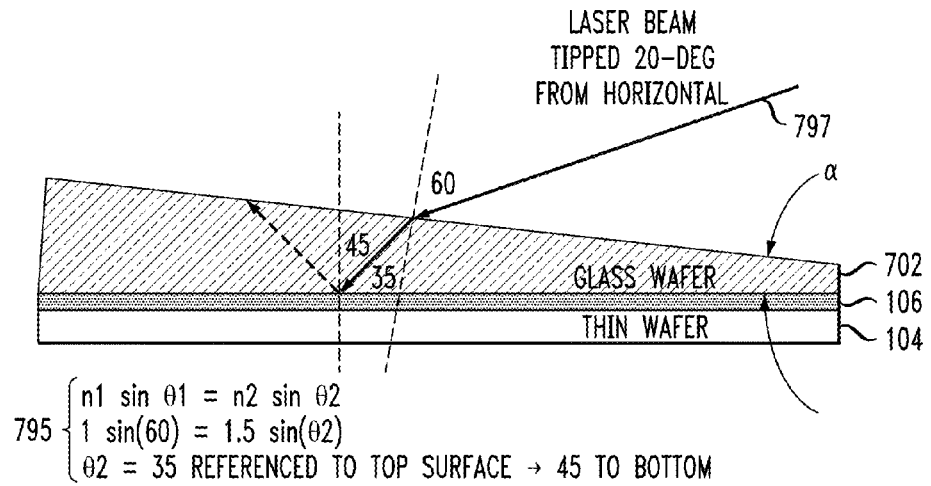
FIGS. 7A-7B present a wedged glass wafer, according to aspects of the invention.
Figure 7B:
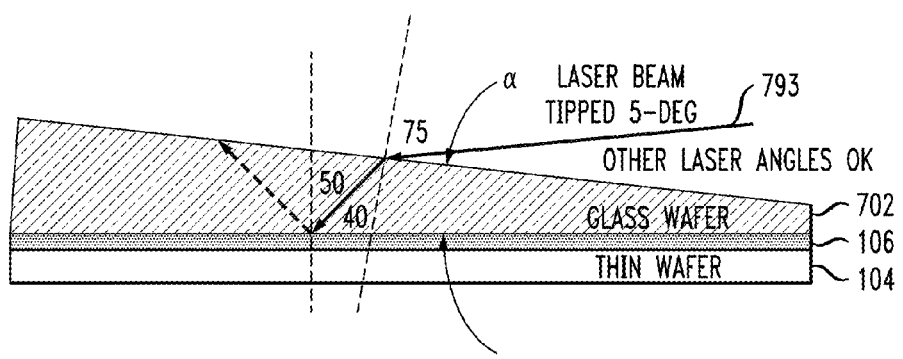

FIGS. 7A and 7B show the use of a wedged glass wafer. The wedge angle allows the achievement of 45-degrees at the bottom polymer/glass interface with only a 35-degree angle is achieved at the top air/glass interface. The glass wafer 702 is wedged (e.g. at an angle α of 10 degrees or larger).

The top surface of wafer 702 or wedge 799 can be anti-reflective (AR) coated to improve efficiency. As seen in FIG. 7A, an incident laser beam 797 is incident at a large angle of 60 degrees from the wedged surface normal (e.g. 70 degrees from the vertical or 20 degrees from the horizontal) and thus when the beam 797 enters the wafer 702 it will be 35 degrees from the normal to the top wedged surface in glass wafer 702 and 45 degrees from the normal of the bottom surface in glass wafer 702. The calculations are seen at 795. As seen in FIG. 7B, other laser angles are functional. See beam 793 tipped 5 degrees from the horizontal. Also consider that a 75 degree from normal beam will exhibit a 50 degree angle at the polymer interface.

Figure 7C:
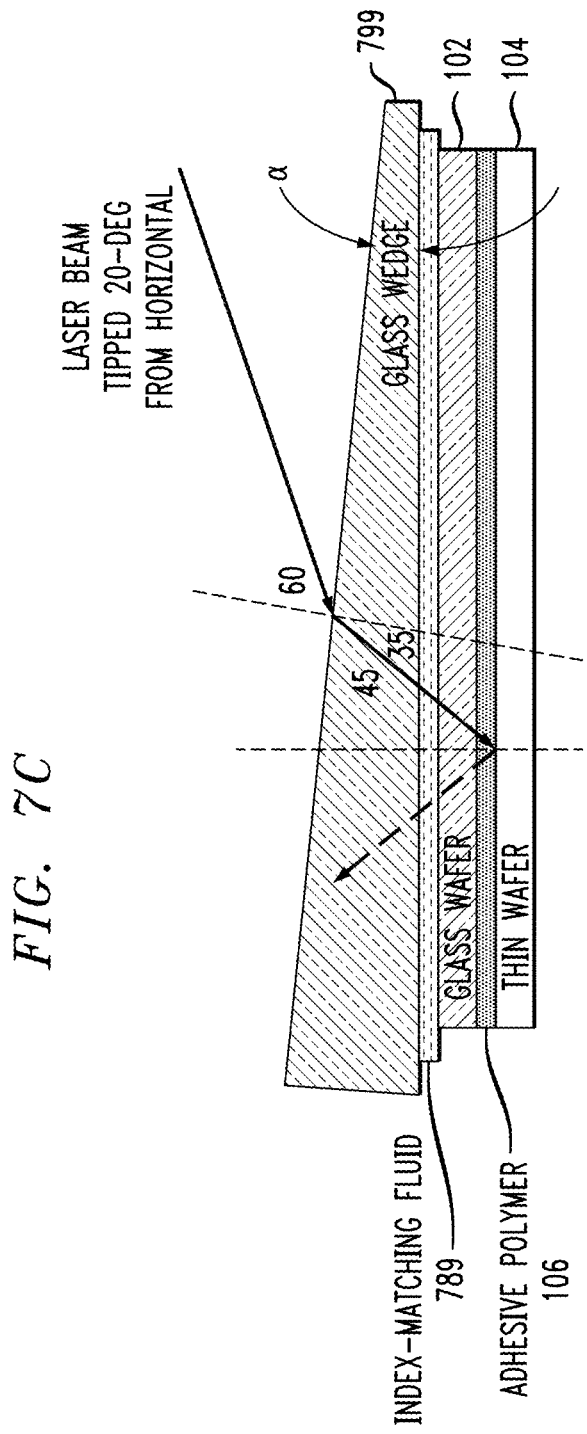
FIG. 7C shows a separate glass wafer, according to an aspect of the invention.

In an alternative approach shown in FIG. 7C, a prism wedge 799 is index matched with fluid 789 to (flat) wafer 102 (FIG. 7C is thus an alternate prism embodiment). The angles in the example of FIG. 7C are the same as in FIG. 7A.

Figure 8A:
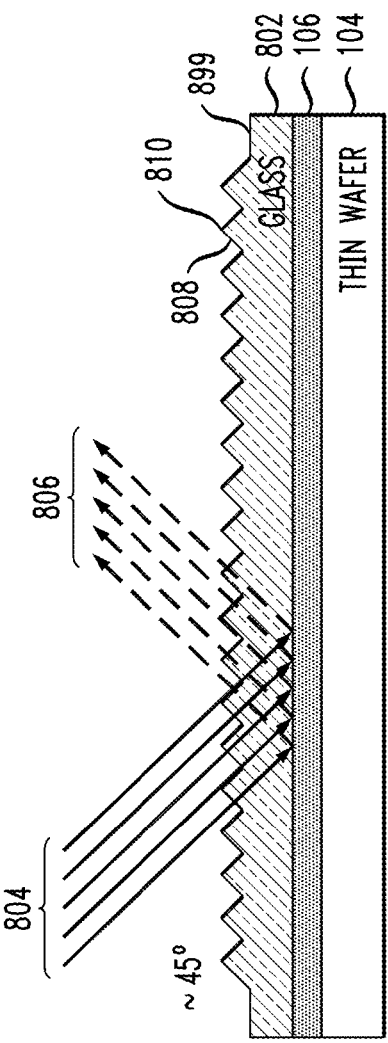
FIGS. 8A and 8B show a micro-structured glass wafer (top surface), according to an aspect of the invention.
Figure 8B:
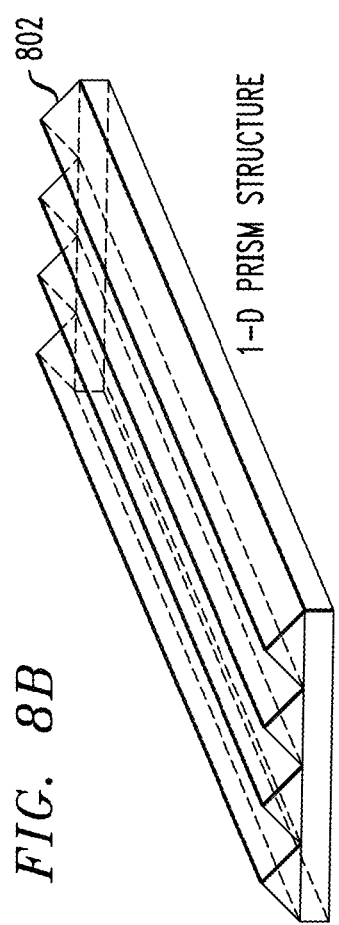

FIGS. 8A and 8B show the use of a prismatic structure on the top surface of the glass wafer 802 to achieve a 45 degree angle of incidence at the bottom glass substrate/polymer interface (where 802 interfaces with 106). The top surface of structure 802 is a one-dimensional prism structure (e.g. 90 degree prisms along the length of the wafer). Light 804 is incident at 45-degrees, normal to left prism faces 808 and parallel to right prism faces 810. With polymer 106 present, beams 804 pass through the interface and ablate the polymer to create an "air" pocket. Once the "air" pocket is present, incident laser beams are reflected off the glass/"air" interface (TIR) as seen at 806. The TIR reflected light also at 45 degrees, normal to output face (right prism face) 810. The dimensions of prisms 802 may vary, for example, from a few microns to a few centimeters. Optionally, the glass prism sheet can be separate, then index-matched to a plane glass wafer, similar to the embodiment of FIG. 6C; i.e., the glass wafer 802 can itself have a top prismatic structure, or the glass wafer 802 can be planar with a separate top prismatic structure and index matching.

Figure 9:
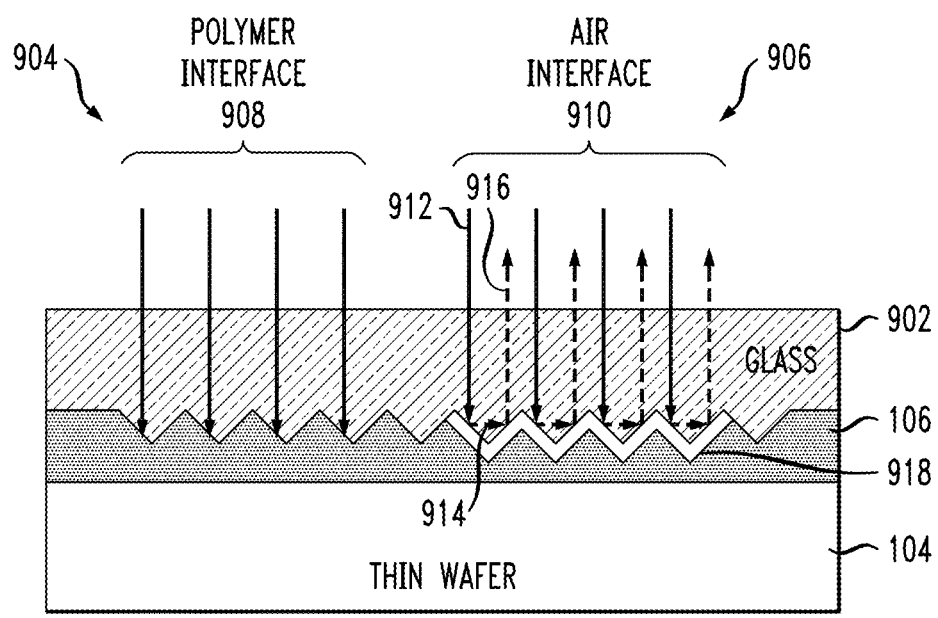
FIG. 9 shows a micro-structured glass wafer (bottom surface), according to an aspect of the invention.
Figure 10:
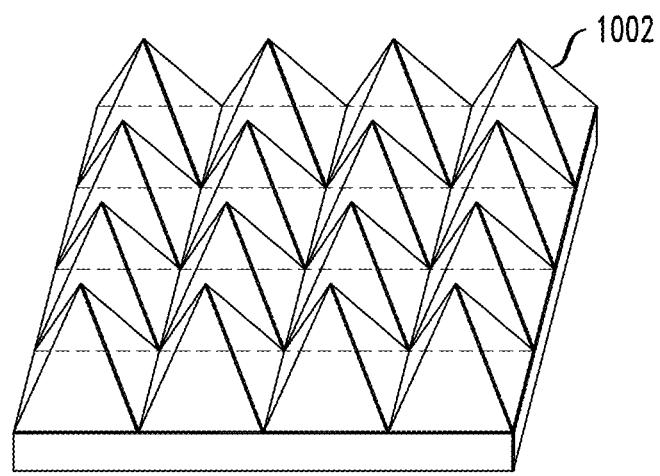
FIG. 10 shows a prism structure useful with the embodiment of FIG. 9, according to an aspect of the invention.

FIGS. 9 and 10 show the use of a prismatic structure on the bottom surface of the glass wafer. While the laser is incident at a near-normal angle to the top surface, the prismatic structure at the bottom surface provides a 45 degree angle of incidence at the glass substrate/polymer interface. Thus, FIGS. 9 and 10 show a micro-structured glass wafer bottom surface. The bottom surface of glass wafer 902 is formed with a prism structure (in one or more embodiments, integrated into the glass wafer). This can be a one dimensional prism structure (e.g. 90-degree prisms along the length of the wafer similar to FIG. 8B) or a two-dimensional prism structure (corner cube or pyramid as seen at 1002 in FIG. 10). The dimensions can be, for example, a few microns. The adhesive layer 106 planarizes the prism surface for handling. The dimensions of the prism, e.g. prism period or height, should be greater than the laser wavelength to minimize losses due to diffraction and scattering.

Location 904 shows normal incidence of laser light 908. A laser tool with vertical illumination designed for the standard wafer de-bonding process, as described in U.S. Pat. No. 5,258,236 and the aforementioned B. Dang at al. and P. Andry et al. papers, can be employed. With adhesive 106 present, light 908 passes through the interface (since the same is index-matched) and ablates polymer 106. Location 906 shows the case after an "air" pocket 918 has been created. With an "air" interface as at 906, TIR occurs at the glass/"air" interface. As seen at 910, incident laser light 912 reflects off the first prism face resulting in ray 914 and then off the second prism face and back towards the input direction as at 916. The process is self-limiting: once the polymer interface is vaporized, the prism surfaces become a retro-reflector.

One or more embodiments thus use the TIR (total internal reflection) effect to limit the laser dose to single pulse. The first pulse with adequate power above the ablation threshold will ablate the polymer. Once ablation at the glass/polymer interface occurs, subsequent pulses are reflected. In one or more embodiments using the TIR (total internal reflection) effect to limit the dose to a single pulse, laser light is incident at 45 degrees to the glass/polymer interface. When polymer is present, laser light will travel through the interface and ablate a sub-micron polymer layer at the interface. This creates an "air" pocket at the interface. Since 45 degree incidence angle exceeds the TIR condition (typically >42 degrees), all subsequent pulses are reflected. This advantageously avoids potential damage from subsequent pulses, and is applicable for all laser types and will beneficially relax scan requirements (power control, beam overlap).

Thus, in one or more embodiments, the TIR (total internal reflection) effect is used to limit the laser dose to a single pulse. The laser light is directed to the glass/polymer interface at 45 degrees from normal to that interface. The first pulse will traverse the glass/polymer interface since the polymer is nearly index-matched to the glass. Light will travel through the interface and the laser will ablate a sub-micron layer of polymer. This creates and "air" pocket where the interface now becomes a glass/gas interface with glass index near 1.5 and gas index near 1.0. For the second and following pulses, light will reflect off the glass/gas interface when the TIR condition is exceeded (angle of incidence >41.8 degrees for glass/"air" indices of 1.5/1.0). The TIR condition is defined according to Snell's Law as set forth above; for $n_1=1$, $n_2=1.5$, the critical angle is 41.8°. Thus at approximately 45 degrees, all subsequent laser pulses will be reflected and will not impinge on the polymer below the "air" pocket. Thus, self-limiting, damage-free laser ablation can be achieved.

However, as noted, an incidence angle in glass >41.8° cannot be achieved in a plane-parallel glass substrate, according to Snell's law from air to glass. The same law provides that the maximum angle that can be achieved in the glass when light is incident from air to glass is <41.8 degrees. One or more embodiments provide one or more approaches to achieve an angle of incidence of about 45 degrees at the glass/polymer interface. These include:
  (1) the use of a glass prism that is index-matched to the glass wafer to direct the light at 45 degrees to the glass polymer interface;
  (2) the use of a wedged glass wafer, rather than a plane-parallel glass wafer, in order to achieve a 45 degree angle of incidence at the glass polymer interface within the glass substrate;
  (3) the use of a micro-structure in the top surface or the bottom surface of the glass wafer in order to enable a 45 degree angle of incidence at the glass polymer interface.

Thus, one or more embodiments provide a laser process for separating a first transparent substrate (e.g. glass wafer 102) bonded to second substrate (circuits wafer 104) using thin layer or layers of polymers 106 where laser light is incident onto the transparent substrate/polymer interface at nominally >40 degrees to the surface normal (typically 45 degrees) and wherein, once the polymer delaminates from the glass interface a gaseous layer 406 is formed at the glass/polymer interface. Subsequent laser pulses 410A are reflected (See 410B) from the glass/gas interface by the Total Internal Reflection condition.

The minimum angle of incidence (θ) depends on the refractive index (n) of the glass substrate given by arc sin(1/n) and is about 42 degrees for Pyrex or Fused Silica.

The prism dimensions should be large enough to accommodate the laser beam and an approximately 45 degree angle of incidence can be achieved through a transparent prism or prisms on the top surface of the first substrate with index matched fluid between the prism and the glass substrate. One example of an index matched fluid with Pyrex is Glycerol.

In some cases, the first transparent substrate is a glass plate 102 with parallel surfaces and the laser light is directed into the glass substrate using a prism, such as a right-angle prism 602, disposed on the outer surface of the glass substrate and oriented with the hypotenuse on the first substrate. An index matching fluid 603 is used between the prism and the glass substrate. The laser light is incident approximately normal to the prism outer face such that the light enters the first transparent substrate at nominally 45 degrees to normal of the glass substrate/polymer interface.

As seen in FIG. 6A, in some instances, the prism is a right-angle prism 602 oriented with the hypotenuse on the first substrate and is translated with the laser beam across the wafer.

As seen in FIG. 6B, in some instances, the prism is an elongated component 608 spanning up to the length of the substrate and is translated in the other dimension as the laser scans through the prism length direction.

As seen in FIG. 6C, in some instances, the prism is an array 610 of elongated elements that fill the substrate and no prism translation is required. The individual prism dimension can be a few microns to a few cm, with the minimum greater than the wavelength of the laser.

Figure 6D:
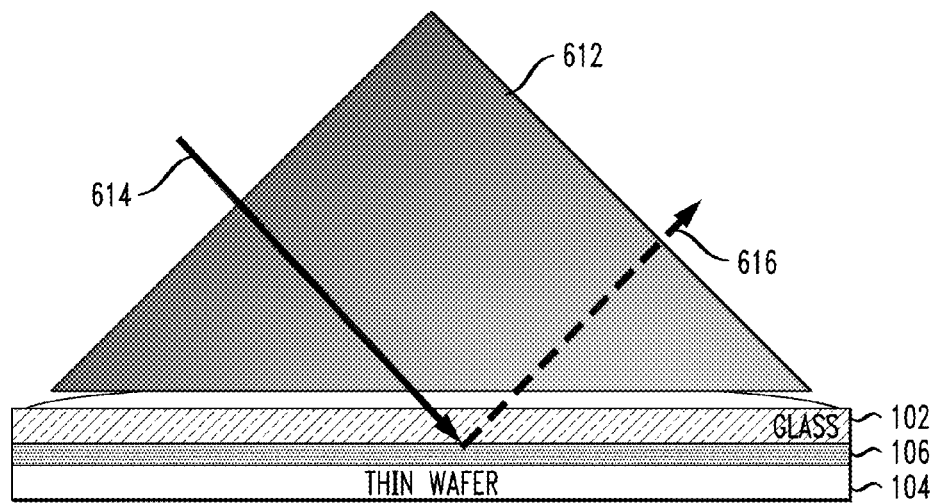

As seen in FIG. 6D, in some instances, the prism is one large component 612 that covers the entire substrate and no prism translation is necessary.

In some cases, as seen in FIGS. 7A and 7B, the first transparent substrate is wedged (e.g. wedged glass wafer 702) with an angle α typically 10 to 30 degrees, and the laser is incident onto the top of the first wedged substrate at a substantially large angle relative to normal, typically 50-85 degrees. Allowing for the wedge angle of the substrate and the refraction effects, the light is redirected at approximately 45 degrees towards the polymer layer(s) 106 the bottom surface of the first substrate 702. Once the polymer delaminates from the glass interface a gaseous layer is formed at the glass/polymer interface and subsequent laser beam pulses are reflected from the glass/gas interface by the Total Internal Reflection condition.

Alternatively, as seen in FIG. 7C, the wedged transparent substrate is a second separate substrate 799 of similar dimension to the first transparent substrate and is placed on the outer face of the first transparent substrate 102 and index-matching liquid 789 is used at the interface of the two substrates.

As seen in FIGS. 8A and 8B, in some embodiments, a prism structure is integrated into the top surface of the first transparent substrate (e.g. glass wafer 802) and the structure is a prismatic array structure with nominally 45 degree angled surfaces such that the laser light 804 is incident approximately normal to one prism surface 808 and such that the light continues at about 45 degrees within the transparent substrate toward the bottom glass/polymer interface (between 802 and 106). Once the polymer delaminates from the glass interface a gaseous layer is formed at the glass/polymer interface and subsequent laser beam pulses are reflected from the glass/gas interface by Total Internal Reflection condition (see 806) toward the structured top surface. The prism is, in some instances, a right-angle prism oriented with the hypotenuse "on" the first substrate and is translated with the laser beam across. That is to say, where wafer 802 is unitary, the hypotenuse is co-planar with surface 899. Where a separate structure is used as in FIG. 6C, there would be some material depth 699 connecting the adjacent prisms (similarly in FIGS. 8B and 10). The dimension of the prism is larger than the wavelength of the laser radiation; e.g., from a few microns up to mm or cm.

Still referring to FIGS. 8A and 8B, in some embodiments, a laser process is provided for separating a first transparent substrate (e.g. glass wafer 802) which has a textured top surface and which is bonded to second substrate (circuits wafer 104) using thin layer or layers of polymers 106. The laser is incident at approximately 45 degrees to the bonded assembly, and the texture is a prismatic array structure 802 with nominally 45 degree angled surfaces such that the laser is incident approximately normal to one prism surface and the light 804 continues at about 45 degrees within the transparent substrate toward the bottom glass/polymer interface. Once the polymer delaminates from the glass interface a gaseous layer is formed at the glass/polymer interface and subsequent laser beam pulses are reflected from the glass/gas interface by Total Internal Reflection condition toward the textured top surface, as seen at 806. The texture includes, in at least some instances, a one dimensional prismatic array 802. The dimension of the texture should be larger than the wavelength of the laser radiation, up to mm or cm.

As seen in FIGS. 9 and 10, in some embodiments, a laser process is provided for separating a first transparent substrate (e.g. glass wafer 902) which has a textured bottom surface bonded to a second substrate (circuits wafer 104) using thin layer or layers of polymers 106 where laser light 908 is normal to the substrate plane and where the texture of the bottom surface is a prismatic array structure with nominally >40 degree angled surfaces (the angle is determined by the refractive index of the glass employed). Once the polymer delaminates from the glass interface a gaseous layer is formed at the glass/polymer interface and subsequent laser beam pulses are reflected from the prismatic glass/gas interface by the Total Internal Reflection condition as seen at 910. The texture can be, for example, one dimensional prismatic arrays similar to 802 but on the bottom surface. As seen in FIG. 10, in some cases, the texture is a 2-D array of pyramid-shaped prisms 1002. The dimension of the texture should be larger than the wavelength of the laser radiation Still referring to FIGS. 9 and 10, in some embodiments, a prism structure is integrated into the bottom surface of the first transparent substrate (e.g. glass wafer 902) and the structure is a prismatic array structure with nominally 45 degree angled surfaces where the adhesive polymer layer 106 conforms to the prismatic structure and produces a planar polymer layer at the polymer/second substrate interface (between 106 and 104), such that laser light 908 incident approximately normal to the top surface of the first transparent substrate continues to the bottom prismatic surface and is incident at about 45 degrees to the prismatic face at the bottom glass/polymer interface. Once the polymer delaminates from the glass interface a gaseous layer 918 is formed at the glass/polymer interface and subsequent laser beam pulses are reflected from the prismatic glass/gas interface by the Total Internal Reflection condition as seen at 910. In some cases, the surface structure is a one dimensional prismatic array with nominally 90-deg vertices orientated with faces 45 degrees (e.g., similar to FIG. 8B but on the bottom). In some cases, such as in FIG. 10, a 2-D array 1002 of pyramid-shaped prisms is employed. The dimension of the prisms should be larger than the wavelength of the laser radiation, typically from a few microns to mm.

Thus, one or more embodiments provide a self-limiting laser de-bonding process for separating a temporary glass substrate from a workpiece (e.g. thinned device wafer). Laser de-bonding uses high power lasers to ablate a polymer adhesive layer at the interface between the temporary glass wafer and the device wafer. Since high power lasers are required, excess laser power or an excess number of pulses can cause damage to underlying devices. The exemplary process uses the Total Internal Reflection (TIR) principle to reduce or completely eliminate excess pulses that can lead to damage. The laser light is directed to the glass/polymer interface at an angle of approximately 45 degrees from normal. Initially, the light will travel through glass/polymer interface and ablate a thin layer of the polymer. The ablation process separates the polymer from the glass and creates a gaseous pocket. The index difference of the glass/gas interface is now sufficiently large to exceed the TIR condition for the 45 degree laser incidence angle, and any additional laser pulses will thus be reflected at this interface.

Given the discussion thus far, it will be appreciated that, in general terms, an exemplary method, according to an aspect of the invention, includes the step of providing a first substrate 102, 702, 802, 902 bonded to a second substrate by a material. The first substrate is transparent to at least some wavelengths of electromagnetic radiation. A further step includes irradiating the first substrate with the electromagnetic radiation to which the first substrate is transparent, such that the electromagnetic radiation impinges on the material causing a decomposition (e.g., 406, 918) thereof at a location at an interface between the first substrate and the material. The decomposition results in, at the location, an interface of the first substrate and an atmosphere of the decomposition. The atmosphere of the decomposition has an optical property resulting in ceasing the decomposition of the material.

In at least some cases, the optical property causes the electromagnetic radiation irradiating the first substrate to substantially totally reflect from the location. For example, the electromagnetic radiation impinges on the material at an angle sufficient to causes the electromagnetic radiation to substantially totally reflect from the location.

In one or more embodiments, the atmosphere causes a bond between the first substrate and the material at the location to be sufficiently diminished to permit the first substrate to be separated from the material.

In some cases, the optical property causes the electromagnetic radiation irradiating the first substrate to have, when impinging on the material, a fluence less than necessary to cause the decomposition.

In one or more embodiments, the irradiating includes exposing to laser radiation and the decomposition includes ablation; the laser radiation may have, as noted, a Gaussian beam or a non-Gaussian beam.

In some instances, in the providing step, the first substrate is a glass and/or a fused silica material transparent to at least one of visible and near-ultraviolet wavelengths of the electromagnetic radiation. However, as noted, in some cases, in the providing step, the first substrate could be a semiconductor wafer transparent to infrared wavelengths of the electromagnetic radiation.

Referring to FIGS. 6A-6D, in some embodiments, a further step includes providing a prism 602, 608, 699, 612 on a top surface of the first substrate. The prism is index-matched to the first substrate, and the irradiating includes irradiating the first substrate through the prism.

In some cases, as per FIG. 6B, the prism has a length at least equal to a diameter of the second substrate, and further steps include scanning a laser providing the laser radiation along the prism; and stepping the first and second substrates and the prism.

In some cases, as per FIG. 6C, an additional step includes providing an array of prisms on a top surface of the first substrate. The array of prisms is index-matched to the first substrate. The irradiating includes irradiating the first substrate through the array of prisms, and a further step includes scanning a laser providing the laser radiation along each prism of the array of prisms.

Referring to FIGS. 7A and 7B, in some cases, in the providing step, the first substrate 702 is formed with a wedge angle selected such that the laser radiation, impinging on the first substrate in air, refracts within the first substrate so as to impinge on the material at the angle sufficient to cause the electromagnetic radiation to substantially totally reflect from the location.

Referring to FIG. 7C, in some cases, a further step includes providing a wedge prism 799 on a top surface of the first substrate. The wedge prism is index-matched to the first substrate. The wedge prism is formed with a wedge angle selected such that the laser radiation, impinging on the wedge prism in air, refracts within the wedge prism so as to impinge on the material at the angle sufficient to cause the electromagnetic radiation to substantially totally reflect from the location.

Referring to FIGS. 8A and 8B, in some cases, the first substrate has an array of prisms formed on a top surface thereof, and the irradiating includes irradiating the first substrate normal to faces of the array of prisms so that the laser radiation impinges on the material at the angle sufficient to cause the electromagnetic radiation to substantially totally reflect from the location.

Referring to FIGS. 9 and 10, in some cases, the first substrate has an array of prisms formed on a bottom surface thereof, and the irradiating includes irradiating the first substrate normal to a planar top surface thereof.

In one or more embodiments, the irradiating includes irradiating the first substrate with a first pulse of the electromagnetic radiation which exceeds ablation threshold fluence, so as to cause the ablation of the material, such that subsequent pulses of the electromagnetic radiation are substantially totally reflected from the location.

In one or more embodiments, the adhesive includes a polyimide polymer; however, as noted, other adhesives could be used.

The second substrate is typically a semiconductor substrate, but as noted, could be a glass substrate for a flat panel display or the like.

Integrated Circuit Fabrication Aspects

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Exemplary System and Article of Manufacture Details—Part 1

One or more embodiments of the invention, or elements thereof, can be implemented in the form of an apparatus including a memory and at least one processor that is coupled to the memory and operative to perform exemplary method steps.

Figure 11:
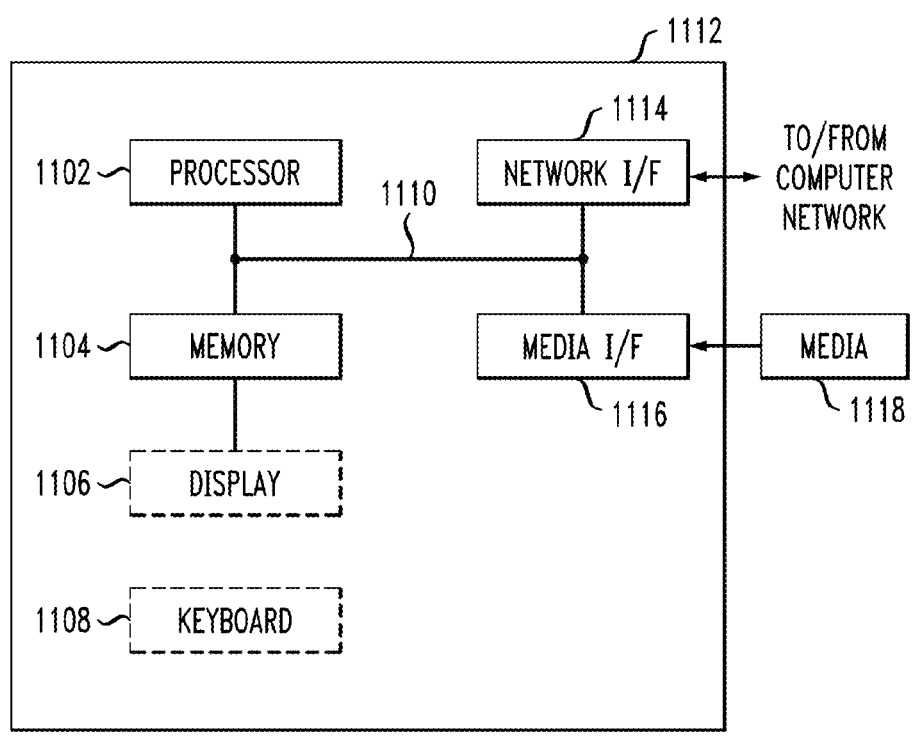
FIG. 11 depicts a computer system that may be useful in implementing one or more aspects and/or elements of the invention.

One or more embodiments can make use of software running on a general purpose computer, workstation, or controller; for example, to control aspects of one or more of the methods described herein, such as the stepping of the chip, laser, and/or prisms and/or the pulsing of the laser. With reference to FIG. 11, such an implementation might employ, for example, a processor 1102, a memory 1104, and an input/output interface formed, for example, by a display 1106 and a keyboard 1108. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1102, memory 1104, and input/output interface such as display 1106 and keyboard 1108 can be interconnected, for example, via bus 1110 as part of a data processing unit 1112. Suitable interconnections, for example via bus 1110, can also be provided to a network interface 1114, such as a network card, which can be provided to interface with a computer network, and to a media interface 1116, such as a diskette or CD-ROM drive, which can be provided to interface with media 1118.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1102 coupled directly or indirectly to memory elements 1104 through a system bus 1110. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1108, displays 1106, pointing devices, and the like) can be coupled to the system either directly (such as via bus 1110) or through intervening I/O controllers (omitted for clarity).

Network adapters such as network interface 1114 may also be coupled to the system to enable the data processing system to become coupled to other data processing systems or remote printers or storage devices through intervening private or public networks. Modems, cable modem and Ethernet cards are just a few of the currently available types of network adapters.

Network interface 1114 is broadly representative of a variety of interfaces that might be used to control a stepper, laser, fabrication tool, or the like; other examples include analog to digital converters, digital to analog converters, and the like.

As used herein, including the claims, a "server" includes a physical data processing system (for example, system 1112 as shown in FIG. 11) running a server program. It will be understood that such a physical server may or may not include a display and keyboard.

It should be noted that any of the methods described herein can include an additional step of providing a system comprising distinct software modules embodied on a computer readable storage medium; the modules can include, for example, modules to control aspects of one or more of the methods described herein, such as the stepping of the chip, laser, and/or prisms and/or the pulsing of the laser. The method steps can then be carried out using the distinct software modules and/or sub-modules of the system, as described above, executing on one or more hardware processors 1102. Further, a computer program product can include a computer-readable storage medium with code adapted to be implemented to carry out one or more method steps described herein, including the provision of the system with the distinct software modules.

Exemplary System and Article of Manufacture Details—Part 2

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a first substrate bonded to a second substrate by a material, said first substrate being transparent to at least some wavelengths of electromagnetic radiation;
   irradiating said first substrate with said electromagnetic radiation to which said first substrate is transparent, such that said electromagnetic radiation impinges on said material causing a decomposition thereof at a location at an interface between said first substrate and said material;
   said decomposition resulting in, at said location, an interface of said first substrate and an atmosphere of said decomposition, said atmosphere of said decomposition having an optical property, wherein irradiating said first substrate is carried out such that said electromagnetic radiation impinges on said interface at an incident angle such that said optical property causes said electromagnetic radiation to substantially totally reflect at said interface, thereby ceasing said decomposition of said material.

2. The method of claim 1, wherein said irradiating comprises exposing to laser radiation and said decomposition comprises ablation.

3. The method of claim 2, wherein said irradiating comprises exposing to laser radiation having a Gaussian beam.

4. The method of claim 2, wherein said irradiating comprises exposing to laser radiation having a non-Gaussian beam.

5. The method of claim 2, wherein, in said providing step, said first substrate comprises at least one of a glass and a fused silica material transparent to at least one of visible and near-ultraviolet wavelengths of said electromagnetic radiation.

6. The method of claim 2, wherein, in said providing step, said first substrate comprises a semiconductor wafer transparent to infrared wavelengths of said electromagnetic radiation.

7. The method of claim 1, further comprising providing a prism on a top surface of said first substrate, said prism being index-matched to said first substrate, wherein said irradiating comprises irradiating said first substrate through said prism.

8. The method of claim 7, wherein said prism has a length at least equal to a diameter of said second substrate, further comprising:
   scanning a laser providing said laser radiation along said prism; and
   stepping said first and second substrates and said prism.

9. The method of claim 1, further comprising providing an array of prisms on a top surface of said first substrate, said array of prisms being index-matched to said first substrate, wherein said irradiating comprises irradiating said first substrate through said array of prisms, further comprising scanning a laser providing said laser radiation along each prism of said array of prisms.

10. The method of claim 1, wherein, in said providing step, said first substrate is formed with a wedge angle selected such that said laser radiation, impinging on said first substrate in air, refracts within said first substrate so as to impinge on said material at said angle sufficient to cause said electromagnetic radiation to substantially totally reflect from said location.

11. The method of claim 1, further comprising providing a wedge prism on a top surface of said first substrate, said wedge prism being index-matched to said first substrate, wherein said wedge prism is formed with a wedge angle selected such that said laser radiation, impinging on said wedge prism in air, refracts within said wedge prism so as to impinge on said material at said angle sufficient to cause said electromagnetic radiation to substantially totally reflect from said location.

12. The method of claim 1, wherein said first substrate has an array of prisms formed on a top surface thereof, wherein said irradiating comprises irradiating said first substrate normal to faces of said array of prisms so that said laser radiation impinges on said material at said angle sufficient to cause said electromagnetic radiation to substantially totally reflect from said location.

13. The method of claim 1, wherein said first substrate has an array of prisms formed on a bottom surface thereof, wherein said irradiating comprises irradiating said first substrate normal to a planar top surface thereof.

14. The method of claim 1, wherein said irradiating comprises irradiating said first substrate with a first pulse of said electromagnetic radiation which exceeds ablation threshold fluence, so as to cause said ablation of said material, such that subsequent pulses of said electromagnetic radiation are substantially totally reflected from said location.

15. The method of claim 1, wherein, in said providing step, said adhesive comprises a polyimide polymer.

16. The method of claim 1, wherein, in said providing step, said second substrate comprises one of a semiconductor substrate and a glass substrate for a flat panel display.

17. A method comprising:
providing a first substrate bonded to a second substrate by a material, said first substrate being transparent to at least some wavelengths of electromagnetic radiation;
irradiating said first substrate with said electromagnetic radiation to which said first substrate is transparent, such that said electromagnetic radiation impinges on said material causing a decomposition thereof at a location at an interface between said first substrate and said material;
said decomposition resulting in, at said location, an interface of said first substrate and an atmosphere of said decomposition, said atmosphere of said decomposition having an optical property, wherein said optical property causes said electromagnetic radiation irradiating said first substrate to have, when impinging on said material, a fluence less than necessary to cause said decomposition.

18. The method of claim 1, wherein said atmosphere causes a bond between said first substrate and said material at said location to be sufficiently diminished to permit said first substrate to be separated from said material.

* * * * *